(12) United States Patent  
Rofougaran

(10) Patent No.: US 9,008,590 B2
(45) Date of Patent: Apr. 14, 2015

(54) LIQUID MEMS COMPONENT AND RF APPLICATIONS THEREOF

(71) Applicant: Broadcom Corporation, Irvine, CA (US)

(72) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 156 days.

(21) Appl. No.: 13/665,605

(22) Filed: Oct. 31, 2012

(65) Prior Publication Data

US 2014/0070984 A1    Mar. 13, 2014

Related U.S. Application Data

(60) Provisional application No. 61/699,183, filed on Sep. 10, 2012.

(51) Int. Cl.
*H04B 1/40* (2006.01)
*H01G 5/16* (2006.01)
*H01G 5/013* (2006.01)
*H01H 29/00* (2006.01)

(52) U.S. Cl.
CPC .............. *H01G 5/16* (2013.01); *H01G 5/0132* (2013.01); *H01H 2029/008* (2013.01)

(58) Field of Classification Search
USPC .................. 455/77, 191.2, 191.3, 290, 178.1; 361/284, 283.4; 200/233
See application file for complete search history.

(56) References Cited

U.S. PATENT DOCUMENTS

| | | | | |
|---|---|---|---|---|
| 7,408,507 | B1* | 8/2008 | Paek et al. | 342/368 |
| 7,477,123 | B2* | 1/2009 | Beerling | 336/200 |
| 7,535,409 | B1* | 5/2009 | Choe et al. | 342/159 |
| 7,671,799 | B1* | 3/2010 | Paek et al. | 342/368 |
| 2004/0150939 | A1 | 8/2004 | Huff | |
| 2007/0042802 | A1 | 2/2007 | Park et al. | |
| 2014/0069783 | A1* | 3/2014 | Rofougaran | 200/233 |
| 2014/0073265 | A1* | 3/2014 | Rofougaran | 455/77 |

FOREIGN PATENT DOCUMENTS

EP    1214854 A1    6/2002

OTHER PUBLICATIONS

European Patent Office; European Search Report; EP Application No. 13004226.0; Nov. 22, 2013; 4 pgs.

(Continued)

*Primary Examiner* — Minh D Dao
(74) *Attorney, Agent, or Firm* — Garlick & Markison; Bruce E. Garlick

(57) ABSTRACT

A radio circuit includes a front-end module, a board, a liquid MEMS component, and a coupling component. The front-end module is implemented on at least one integrated circuit (IC) die and includes a variable circuit. The variable circuit is adjustable to facilitate an operational adjustment of the front-end module for a given operational condition of the radio circuit. The board supports the liquid MEMS component and supports, at least indirectly, the at least one IC. The coupling component electrical couples the liquid MEMS component to the variable circuit, wherein, based on a control signal, one or more characteristics of the liquid MEMS component is changed, which adjusts the variable circuit.

20 Claims, 9 Drawing Sheets

(56) References Cited

OTHER PUBLICATIONS

Traille et al.; A Wireless Passive RCS-Based Temperature Sensor Using Liquid Metal and Microfluidics Technologies; Oct. 10, 2011; pp. 45-48; 2011 41st European Microwave Conference.
Sen et al.; A Liquid-Solid Direct Contact Low-Loss RF Micro Switch; IEEE Journal of Microelectromechanical Systems; Oct. 1, 2009; pp. 990-997; vol. 18, No. 5.
Sen et al.; Electrostatic Fringe-Field Actuation for Liquid-Metal Droplets; Jun. 5, 2005; pp. 705-708; vol. 1, No. 5; 13th International Conference on Solid-State Sensors, Actuators and Microsystems.
Latorre et al.; Electrostatic Actuation of Microscale Liquid-Metal Droplets; Journal of Microelectromechanical Systems; Aug. 1, 2002; pp. 302-308; vol. 11, No. 4.
European Patent Office; European Search Report; EP Application No. 13004236.9; Nov. 22, 2013; 4 pgs.
Simon et al., "A Liquid-Filled Microrelay with a Moving Mercury Microdrop," Journal of Microelectromechanical Systems, vol. 6, No. 3, Sep. 1997; 9 pgs.
Sen, P.; Chang-Jin Kim, "A Liquid-Metal RF MEMS Switch with DC-to-40 GHz Performance," Micro Electro Mechanical Systems, 2009. MEMS 2009. IEEE 22nd International Conference on, pp. 904-907, Jan. 25-29, 2009; 4 pgs.
Kondoh et al., "High-Reliability, High-Performance RF Micromachined Switch Using Liquid Metal," Journal of Microelectromechanical Systems, vol. 14, No. 2, Apr. 2005; 7 pgs.
Chung-Hao Chen; Peroulis, D., "Liquid RF MEMS Wideband Reflective and Absorptive Switches," Microwave Theory and Techniques, IEEE Transactions on, vol. 55, No. 12, pp. 2919-2929, Dec. 2007; 11 pgs.
Varadan, V. K., Vinoy, K.J. and Jose, K.A., "Microelectromechanical Systems (MEMS) and Radio Frequency MEMS, in RF MEMS and Their Applications," John Wiley & Sons, Ltd, Chichester, UK; pp. 1-49, May 2003; 49 pgs.

\* cited by examiner

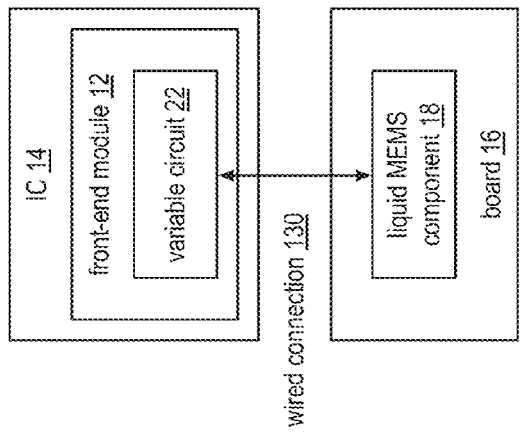
FIG. 13
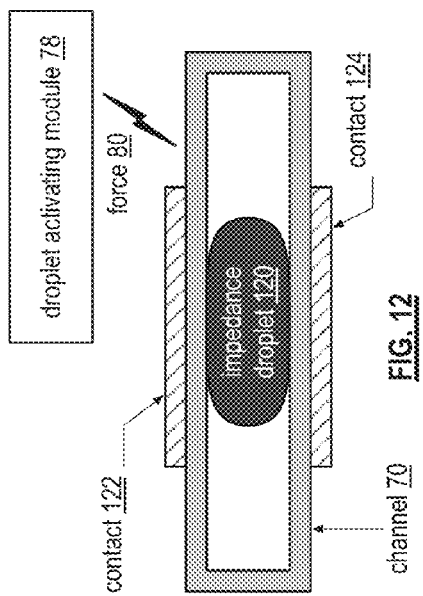
FIG. 12
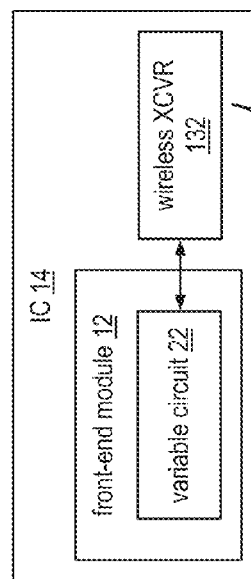
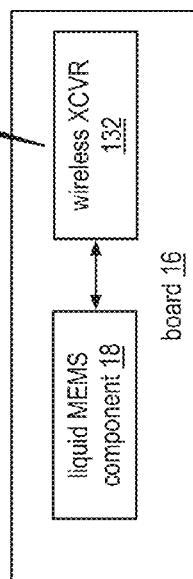
FIG. 14

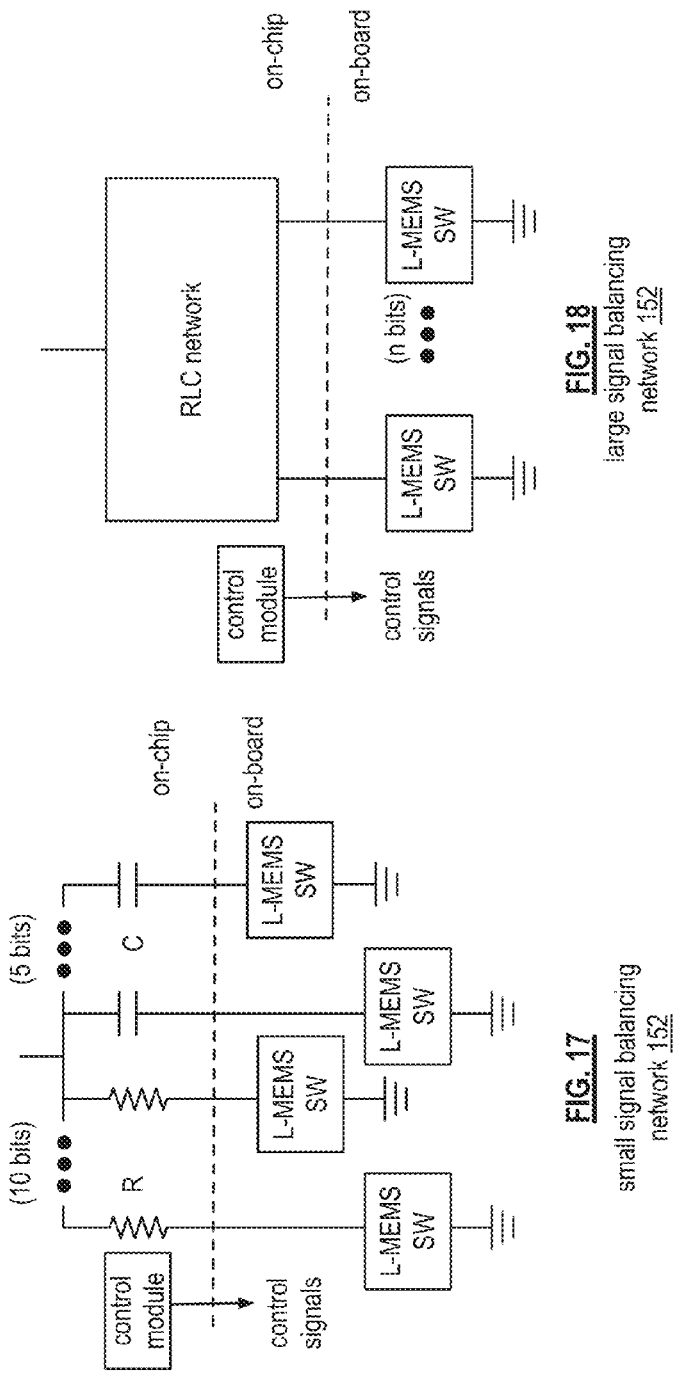
FIG. 18
large signal balancing network 152
FIG. 17
small signal balancing network 152
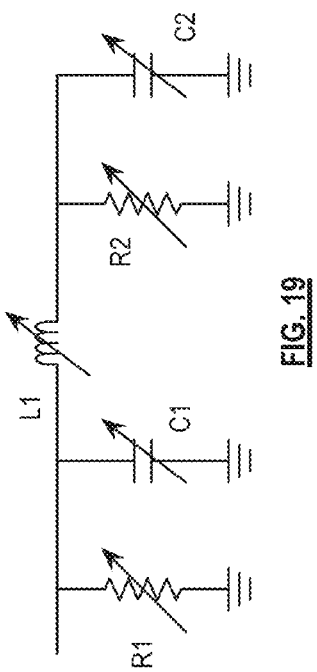
FIG. 19
balancing network 152

US 9,008,590 B2

LIQUID MEMS COMPONENT AND RF APPLICATIONS THEREOF

CROSS REFERENCE TO RELATED PATENTS

The present U.S. Utility Patent Application claims priority pursuant to 35 U.S.C. §119(e) to U.S. Provisional Application No. 61/699,183, entitled "Liquid Micro Electro Mechanical Systems (MEMS) Devices and Applications," filed Sep. 10, 2012, which is incorporated herein by reference in its entirety and made part of the present U.S. Utility Patent Application for all purposes.

STATEMENT REGARDING FEDERALLY SPONSORED RESEARCH OR DEVELOPMENT

Not applicable

INCORPORATION-BY-REFERENCE OF MATERIAL SUBMITTED ON A COMPACT DISC

Not applicable

BACKGROUND OF THE INVENTION

1. Technical Field of the Invention

This invention relates generally to radio communications and more particularly to wireless communication devices utilizing one or more liquid MEMS components.

2. Description of Related Art

Radio frequency (RF) communication devices are known to facilitate wireless communications in one or more frequency bands in accordance with one or more wireless communication protocols or standards. To accommodate multiple communication protocols, or standards, an RF communication device includes multiple versions (one for each protocol) of each section of the RF communication device (e.g., baseband processing, RF receiver, RF transmitter, antenna interface) and/or includes programmable sections. For example, an RF communication device may include a programmable baseband section, multiple RF receiver sections, multiple RF transmitter sections, and a programmable antenna interface.

To provide at least some of the programmable capabilities of a programmable section of an RF communication device, the section includes one or more programmable circuits, wherein the programmability is achieved via a switch-based bank of circuit elements (e.g., capacitors, inductors, resistors). For instance, selecting various combinations of a switch-based bank of capacitors and switch-based bank of inductors yields various resonant tank circuits that can be used in filters, as loads in amplifiers, etc. A recent advance in RF technology is to use integrated circuit (IC) micro-electromechanical system (MEMS) switches to provide the switches of a switch-based bank of circuit elements.

Issues with IC MEMS switches include minimal contact areas (which creates heat spots), bouncing of electrical contact (which limits use to cold switching), and a limited life cycle. In response to these issues, more recent advances in RF technology employ IC implemented liquid RF MEMS switches (which may also be referred to as electro-chemical wetting switches). As IC fabrication technologies continue to evolve and reduce the size of IC dies and components fabricated thereon, IC implemented liquid RF MEMS switches may have limited applications.

BRIEF DESCRIPTION OF THE SEVERAL VIEWS OF THE DRAWING(S)

FIG. 12 is a schematic block diagram of an embodiment of a liquid MEMS resistor in accordance with the present invention;

FIG. 13 is a schematic block diagram of another embodiment of a radio circuit in accordance with the present invention;

FIG. 14 is a schematic block diagram of another embodiment of a radio circuit in accordance with the present invention;

FIG. 17 is a schematic block diagram of an embodiment of a balancing network in accordance with the present invention;

FIG. 18 is a schematic block diagram of another embodiment of a balancing network in accordance with the present invention; and FIG. 19 is a schematic block diagram of another embodiment of a balancing network in accordance with the present invention.

DETAILED DESCRIPTION OF THE INVENTION

Figure 1:
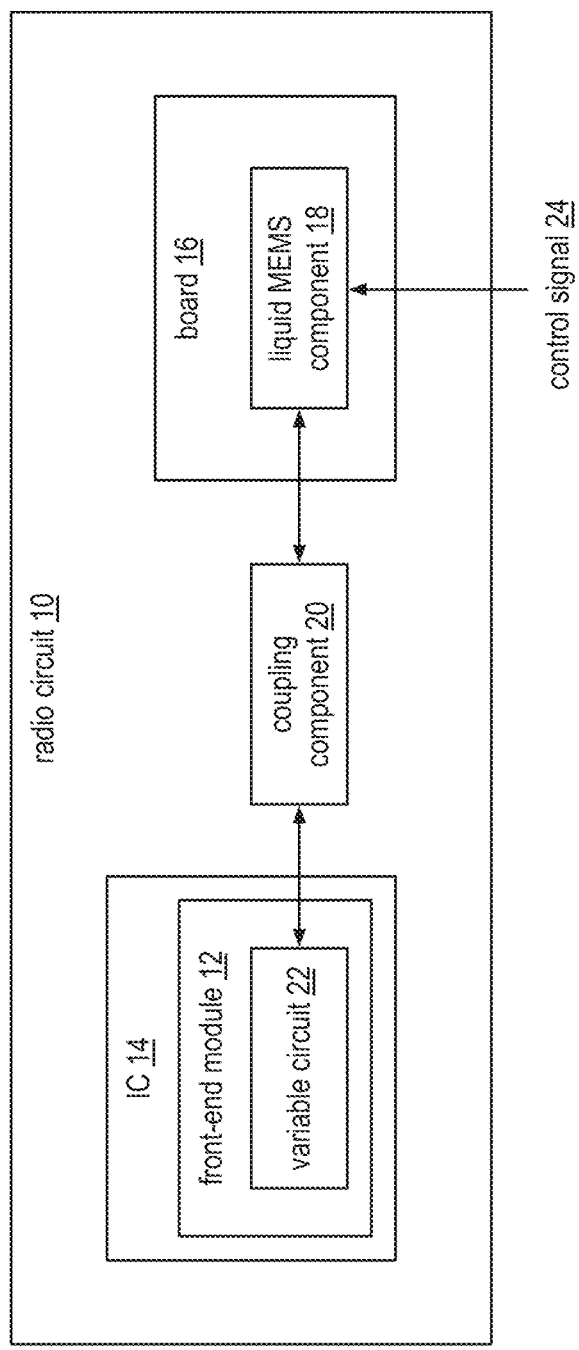
FIG. 1 is a schematic block diagram of an embodiment of a radio circuit in accordance with the present invention.

FIG. 1 is a schematic block diagram of an embodiment of a radio circuit 10 that may be used in portable computing communication devices. A portable computing communication device may be any device that can be carried by a person, can be at least partially powered by a battery, includes a radio transceiver (e.g., radio frequency (RF) and/or millimeter wave (MMW)) and performs one or more software applications. For example, the portable computing communication device may be a cellular telephone, a laptop computer, a personal digital assistant, a video game console, a video game player, a personal entertainment unit, a tablet computer, etc.

As shown, the radio circuit 10 includes an integrated circuit (IC) 14, a board 16, and a coupling component 20. The integrated circuit 14 includes one or more dies on which a front-end module 12 is implemented. The front-end module 12 includes at least one variable circuit 22. The board 16 supports, at least indirectly, the IC 14 and includes one or more liquid micro-electro-mechanical system (MEMS) components.

In an example of operation, the front-end module 12 is coupled to an antenna structure (not shown), which may include one or more antennas, an antenna array, etc. The front-end module 12 is also coupled to a receiver section of a portable computing communication device (not shown) and a transmitter section (not shown) of the portable computing communication device. For a given operational condition of the radio circuit 10, one or more characteristics of the liquid MEMS component(s) is changed via a control signal 24. By changing the liquid MEMS component(s), the variable circuit 22 is adjusted, which adjusts the operation of the front-end module 12.

As a more specific example, the operational condition of the radio circuit 10 is a mode change (e.g., change from one mode of operation in accordance with one wireless communication protocol to another mode of operation in accordance with another wireless communication protocol). In this specific example, the frequency band of operation is being changed from one frequency band to another; accordingly, the front-end module is adjusted it function from the one frequency band to the other. Such an adjustment includes, but is not limited to, one or more of changing impedance matching capabilities of the front-end module 12, changing receive-transmit isolation capabilities, and changing antenna tuning characteristics.

To facilitate the operational adjustment of the front-end module 12 (e.g., change one or more of mode selection, ATU tuning, RX-TX isolation tuning, RF filter tuning, and PA configuration), the operation of the variable circuit 22 is adjusted by changing characteristics of the liquid MEMS component(s) (which may be a switch, a capacitor, an inductor, a transformer, a resistor, etc.) via the control signal 24. For instance, the gain, the frequency band of operation, the bandwidth, blocker rejection, signal to noise ratio, signal to interference ratio, impedance, inductance, and/or capacitance of the variable circuit 22 may be changed by changing the characteristics of the liquid MEMS component 18, where the characteristics includes one or more of on/off state, impedance, capacitance, inductance, resistance, etc. Note that the variable circuit 22 may be a power amplifier, an RF filter, a receive-transmit (RX-TX) isolation module, an antenna tuning unit (ATU), a frequency band (FB) selection switch, and/or a component thereof.

Other examples of operational conditions of the radio circuit 10 include, but are not limited to, half duplex communication, full duplex communication, common receive-transmit channel communication, receive channel selection, transmit channel selection, etc. For each of these operational conditions, a control signal 24 is provided to the liquid MEMS component(s) 18 to change its characteristics, which adjusts operation of the variable circuit 22, which, in turn, adjusts the operation of the front-end module 12.

Regardless of the particular operational conditions being performed by the radio circuit 10, the liquid MEMS component(s) 18 are supported by the board 16, which may be a printed circuit board (PCB), an integrated circuit (IC) package substrate, a redistribution layer (RDL) of the PCB or of the IC package substrate, etc. The liquid MEMS component(s) 18 may be fabricated into the board 16 or may be separate components embedded into the board 16. By implementing the liquid MEMS component(s) 18 on a board 16 instead of an IC 14, the size of the liquid MEMS component 18 may be tens, hundreds, or thousands of times larger than a corresponding component implemented on an IC, which allows for components that are impractical to near impossible to implement on an IC, especially with newer IC fabrication processes, to be readily implemented on a board. Note that a majority of the components of the front-end module 12 are implemented on chip (i.e., on one or more dies of the IC 14).

Figure 2:
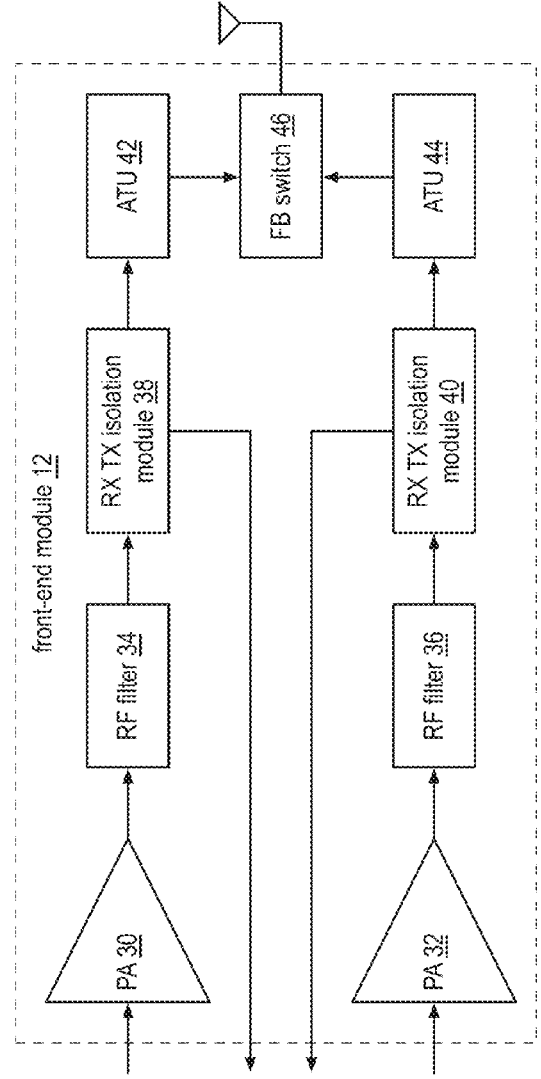
FIG. 2 is a schematic block diagram of an embodiment of a front-end module in accordance with the present invention.

FIG. 2 is a schematic block diagram of an embodiment of a front-end module 12 that includes one or more power amplifiers (PA) 30 32, one or more RF filters 34 36, one or more RX TX isolation modules 38 40, one or more antenna tuning units ATU) 42 44, and may further include a frequency band (FB) switch 46. In the present illustration, the front-end module 12 supports a dual mode (e.g., two different frequency bands of operation) for a portable computing communication device.

As an operational example for an outbound RF signal, one of the PAs 30 32, which includes one or more power amplifiers coupled in series and/or in parallel, amplifies the outbound RF signal. If the PA 30 32 includes one or more variable circuits, one or more of the parameters of the PA (e.g., gain, linearity, bandwidth, efficiency, noise, output dynamic range, slew rate, rise rate, settling time, overshoot, stability factor, etc.) may be adjusted based on the control signal 24. For instance, as transmission conditions change (e.g., channel response changes, distance between TX unit and RX unit changes, antenna properties change, etc.), a processing resource determines to adjust a parameter of the PA to optimize performance. Such a determination may not made in isolation; it is done in light to other parameters of the front-end module that may be adjusted (e.g., the ATU, the RX-TX isolation module) to optimize transmission and/or reception of the RF signals.

The RF filter 34 36, which may be a bandpass filter, low pass filter, notch filter, or high pass filter, filters the amplified outbound RF signal. If the RF filter 34 36 includes one or more variable circuits, one or more of the parameters of the RF filter (e.g., gain, linearity, bandwidth, roll-off, etc.) may be adjusted based on the control signal 24.

The RX-TX isolation module 38 40 (which may be a duplexer, a circulator, or transformer balun, or other device that provides isolation between a TX signal and an RX signal using a common antenna) attenuates the filtered outbound RF signal. If the RX-TX isolation module 38 includes one or more variable circuits 22, operation of the RX-TX isolation module 38 may be adjusted via the control signal 24. Such an adjustment may change how the RX-TX isolation module 38 attenuates the outbound RF signal. For example, when the transmission power is relatively low, the RX-TX isolation module 38 may be adjusted to reduce its attenuation of the outbound RF signal.

The antenna tuning unit (ATU) 42 44 is tuned to provide a desired impedance that substantially matches that of the antenna. As tuned, the ATU 42 44 provides the attenuated TX signal to the antenna for transmission. Note that the ATU may include one or more variable circuits 22 that are continually or periodically adjusted to track impedance changes of the antenna. For example, a baseband processing unit and/or a processing module may detect a change in the impedance of the antenna and, based on the detected change, provide control signal 24 to the ATU 42 44 such that it changes it impedance accordingly. A similar, but reversed, process is performed for received inbound RF signals.

Figure 3:
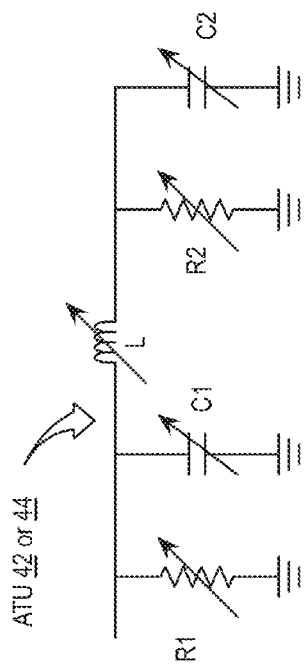
FIG. 3 is a schematic block diagram of an embodiment of an antenna tuning unit in accordance with the present invention.
Figure 6:
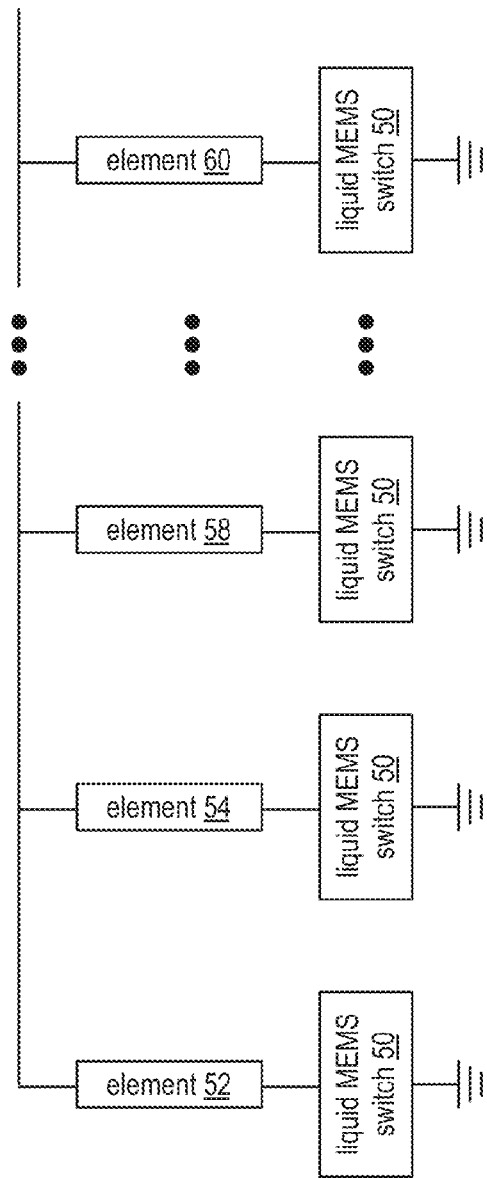
FIG. 6 is a schematic block diagram of an embodiment of a switched bank of circuit elements in accordance with the present invention.
Figure 10:
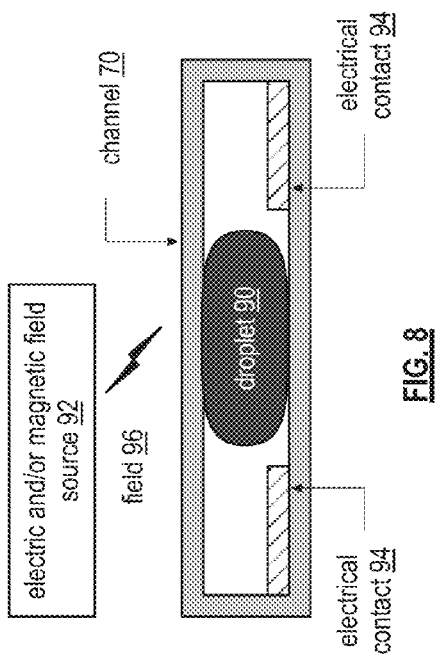
FIG. 10 is a schematic block diagram of an embodiment of a liquid MEMS capacitor in accordance with the present invention.
Figure 11:
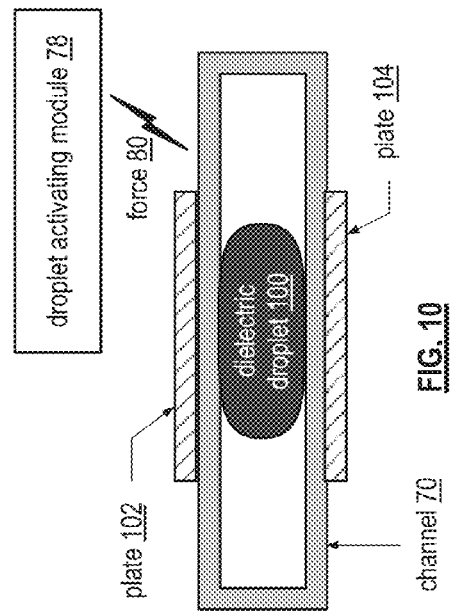
FIG. 11 is a schematic block diagram of an embodiment of a liquid MEMS inductor or transformer in accordance with the present invention.

FIG. 3 is a schematic block diagram of an embodiment of an antenna tuning unit 42 44 that includes one or more variable resistors (R1 and R2), one or more variable capacitors (C1 and C2), and a variable inductor (L). One or more of the components (e.g., resistors, capacitors, inductors) may be changed via the control signal 24. Each of the variable components may be implemented as a variable liquid MEMS component (as shown in FIGS. 10-12) and/or as a switched bank of circuit elements (as shown in FIG. 6). The switched bank of circuit elements includes circuit elements (e.g., resistors, capacitors, inductors), which are on the IC 14 and liquid MEMS switches, which are on the board 16. Note that one or more of the components (e.g., resistors, capacitors, inductors) of the ATU 42 44 may be fixed valued components (e.g., a fixed resistor, a fixed capacitor, and/or a fixed inductor).

Figure 4:
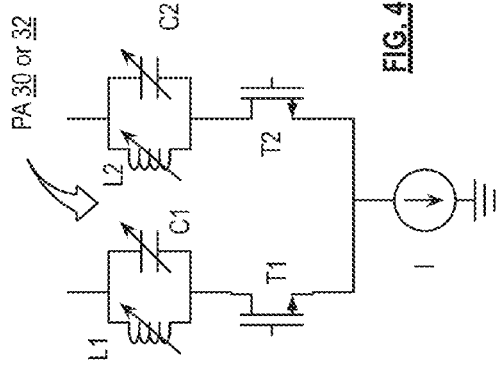
FIG. 4 is a schematic block diagram of an embodiment of a power amplifier in accordance with the present invention.

FIG. 4 is a schematic block diagram of an embodiment of a power amplifier 30 32 that includes a pair of input transistors (T1 and T2), a current source (I), and a pair of loads, each of which includes one or more variable capacitors (C1 C2), and one or more variable inductors (L1 L2). One or more of the components (e.g., capacitors, inductors) may be changed via the control signal 24. Each of the variable components may be implemented as a variable liquid MEMS component (as shown in FIGS. 10-11) and/or as a switched bank of circuit elements (as shown in FIG. 6). The switched bank of circuit elements includes circuit elements (e.g., capacitors, inductors), which are on the IC 14 and liquid MEMS switches, which are on the board 16. Note that one or more of the components (e.g., capacitors, inductors) of the PA 30 32 may be fixed valued components (e.g., a fixed capacitor and/or a fixed inductor).

Figure 5:
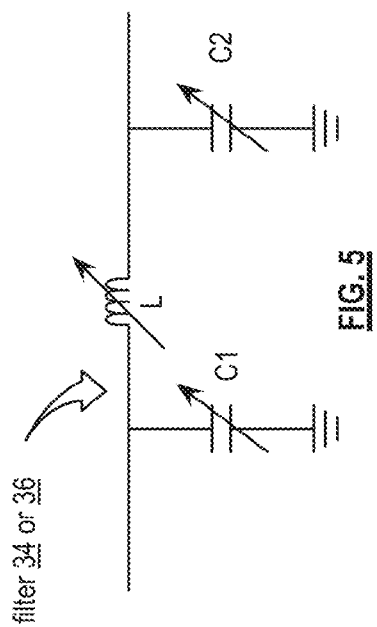
FIG. 5 is a schematic block diagram of an embodiment of a filter in accordance with the present invention.

FIG. 5 is a schematic block diagram of an embodiment of an RF filter 34 36, or portion thereof, that includes one or more variable capacitors (C1 C2), and one or more variable inductors (L). One or more of the components (e.g., capacitors, inductors) may be changed via the control signal 24. Each of the variable components may be implemented as a variable liquid MEMS component (as shown in FIGS. 10-11) and/or as a switched bank of circuit elements (as shown in FIG. 6). The switched bank of circuit elements includes circuit elements (e.g., capacitors, inductors), which are on the IC 14 and liquid MEMS switches, which are on the board 16. Note that one or more of the components (e.g., capacitors, inductors) of the RF filter 34 36 may be fixed valued components (e.g., a fixed capacitor and/or a fixed inductor).

FIG. 6 is a schematic block diagram of an embodiment of a switched bank of circuit elements that includes a plurality of circuit elements 52-60 and a plurality of liquid MEMS switches 50. The liquid MEMS switches 50 are on the board 16 and at least most of the plurality of circuit elements 52-60 is implemented on the IC 14. Note that one or more of the circuit elements 52-60 may be a variable liquid MEMS component. In this instance, the variable liquid MEMS component is on the board 16, which provides a greater range of programmability for the bank of circuit elements. Note that each of the circuit elements (e.g., resistors, capacitors, or inductors) may be of the same value (e.g., same resistance, same capacitance, or same inductance), of different values, or a combination thereof.

Figure 7:
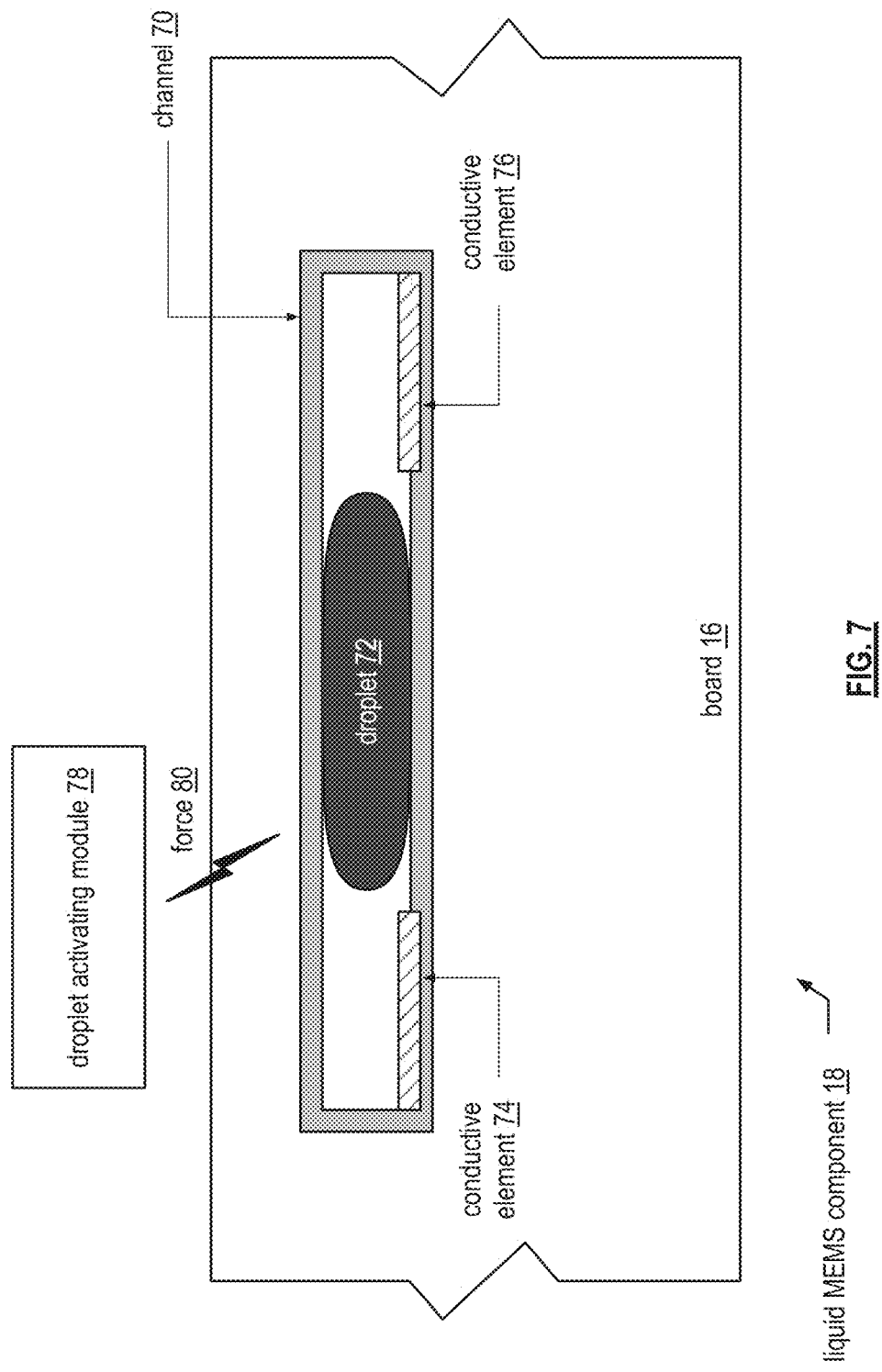
FIG. 7 is a schematic block diagram of an embodiment of a liquid micro-electro-mechanical system (MEMS) component in accordance with the present invention.

FIG. 7 is a schematic block diagram of an embodiment of a liquid micro-electro-mechanical system (MEMS) component 18, which is supported one or more layers of the board 16 (e.g., fabricated therein or embedded therein). The liquid MEMS component 18 includes a channel 70, one or more conductive elements 74-76, a droplet 72, and a droplet activating module 78. The channel 70 is in one or more layers of the board 16 or in one or more layers of another board that is subsequently embedded into the board 16. The droplet 72 is contained in the channel 70.

In an example of operation, the droplet activating module 78, based on the control signal, applies a force 80 to modify the droplet 72 with respect to the one or more conductive elements 74-76 thereby changing the one or more characteristics of the liquid MEMS component 18. For instance, the droplet activating module 78 may be an electric field source, a magnetic field source, a heat source, a compression source, and/or an expansion source to apply a force 80 (e.g., an electric field, a magnetic field, heat, compression, etc.) on the droplet 72 to actuate, alter, move, compress, expand, etc. the droplet 72 to facilitate the characteristic change of the liquid MEMS component 18. Note that the droplet 70 may be one or more of an electrically conductive droplet (e.g., mercury or other metal or electrically conductive substance that is in a liquid state at room temperature), a liquid insulating droplet, an expanding liquid droplet that expands in response to the force of the droplet activating module, a contracting liquid droplet that contracts in response to the force of the droplet activating module, a repelling liquid droplet that is repelled in response to the force of the droplet activating module, and an attraction liquid droplet that is attracted in response to the force the droplet activating module being operable.

In further of the present embodiment or in another embodiment, the channel 70 may include a conductive coating on at least one inner surface of the channel, may include an insulator coating on one or more inner surfaces of the channel, and/or may include a lid in another layer of the board. Additionally, the liquid MEMS component 18 may include a gas (air, a gas mixture, inert gas, noble gas, etc.) within the channel 70, wherein the gas facilitates modifying the droplet 70 when the droplet activating module 78 is operable.

Figure 8:
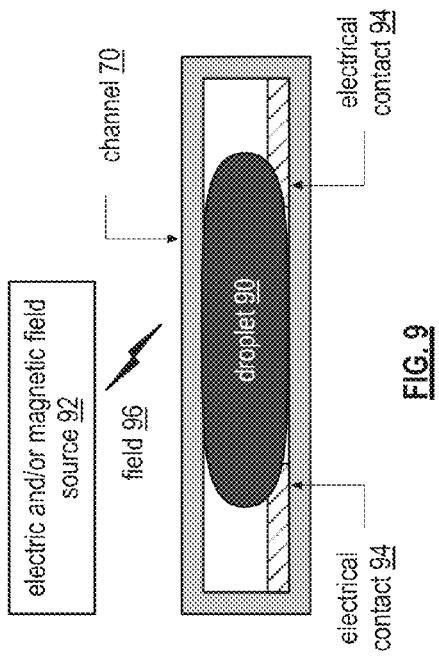
FIGS. 8 and 9 are schematic block diagrams of an embodiment of a liquid MEMS switch in accordance with the present invention.
Figure 9:
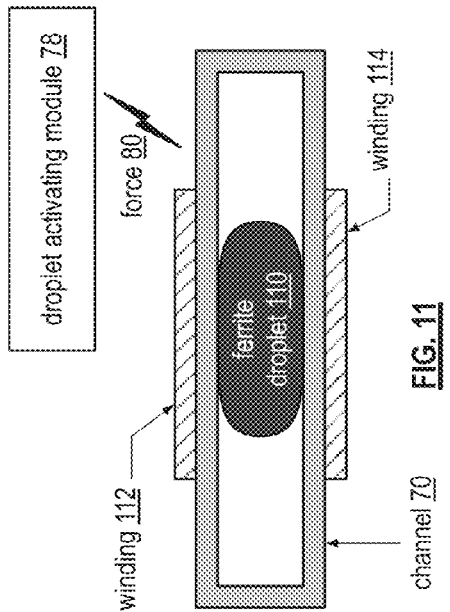

FIGS. 8 and 9 are schematic block diagrams of an embodiment of a liquid MEMS switch that includes the channel 70, a droplet 90, electrical contacts 94, and an electric and/or magnetic field source 92. The droplet 90 is electrically conductive and its shape changes in the presence of a field 96 (electric and/or magnetic) produced by the electric and/or magnetic field source 92. For example, with a minimal field applied, the droplet 90 is not in contact with one or more of the electrical contracts 94. As such the switch is open. When a sufficiently large (or active) field 96 is applied, the shape of the droplet 90 changes causing it to make contact with the electrical contracts 94. As such, the switch is closed. The electric and/or magnetic field source 92 generates the field 96 in response to the control signal 24.

FIG. 10 is a schematic block diagram of an embodiment of a liquid MEMS capacitor that includes a channel 70, a dielectric droplet 100, capacitive plates 102 104, and a droplet activating module 78. The droplet 100 is a dielectric doped solution (e.g., a liquid with dielectric particles) and its shape changes in the presence of a force 80 (electric field, magnetic field, compression, actuation, etc.). For example, with a minimal force applied, the droplet 100 is in a contracted shape, which provides a first dielectric property for the capacitor. When a sufficiently large (or active) force 80 is applied, the shape of the droplet 100 changes, which changes the dielectric properties of the capacitor. Note that the capacitance of a capacitor is $C = \in_r \in_0 (A/d)$, where C is the capacitance, A is the area of overlap of the two plates, $\in_r$ is the relative static permittivity (e.g., dielectric constant) of the material between the plates, $\in_0$ is the electric constant, and d is the distance between the two plates. As such, by changing the dielectric properties, the dielectric constant is changed, which proportionally changes the capacitance.

FIG. 11 is a schematic block diagram of an embodiment of a liquid MEMS inductor or transformer that includes a channel 70, a ferrite droplet 110, one or more windings 112 114 (e.g., one for an inductor, two in series or parallel for an inductor, two for a transformer), and a droplet activating module 78. The droplet 110 is a ferrite doped solution (e.g., a liquid with ferrite particles) and its shape changes in the presence of a force 80 (electric field, magnetic field, compression, actuation, etc.). For example, with a minimal force applied, the droplet 110 is in a contracted shape, which provides a first core property for the inductor or transformer. When a sufficiently large (or active) force 80 is applied, the shape of the droplet 110 changes, which changes the core properties of the inductor or transformer. Note that for a solenoid inductor, inductance is $L=\mu_0\mu_r N^2(A/l)$, where L is inductance, $\mu_0$ is the magnetic constant, $\mu_r$ is the relative permeability of the material within the solenoid, N is the number of turns, A is the cross-sectional area of the solenoid, and l is the length of the winding. As such, by changing the core properties (e.g., the relative permeability) of the magnetic component, its inductance is changed.

FIG. 12 is a schematic block diagram of an embodiment of a liquid MEMS resistor that includes a channel 70, an impedance droplet 120, contacts 122 124, and a droplet activating module 78. The droplet 120 is an impedance doped solution (e.g., a liquid with conductive particles) and its shape changes in the presence of a force 80 (electric field, magnetic field, compression, actuation, etc.). For example, with a minimal force applied, the droplet 120 is in a contracted shape, which provides a first impedance property for the resistor. When a sufficiently large (or active) force 80 is applied, the shape of the droplet 120 changes, which changes the impedance properties of the resistor. Note that resistance $R=\rho(l/A)$, where $\rho$ is the electrical resistivity of the material, l is the length of the conductive material, and A is cross sectional area of the conductive material. As such, by changing the electrical resistivity, the impedance of the resistor is changed.

FIG. 13 is a schematic block diagram of another embodiment of a radio circuit 10 that includes the liquid MEMS component 18 coupled to the variable circuit 22 of the front-end module via a wired connection 130. The wired connection 130 may be one or more traces on the board 16 soldered to one or more leads of the IC 14, a ball grid array on the IC and corresponding mating on the board 16, etc.

FIG. 14 is a schematic block diagram of another embodiment of a radio circuit 10 that includes the liquid MEMS component 18 coupled to the variable circuit 22 of the front-end module via a wireless connection. To wirelessly communicate, the liquid MEMS component 18 and the variable circuit 22 are coupled to wireless transceivers (XCVR) 132.

Figure 15:
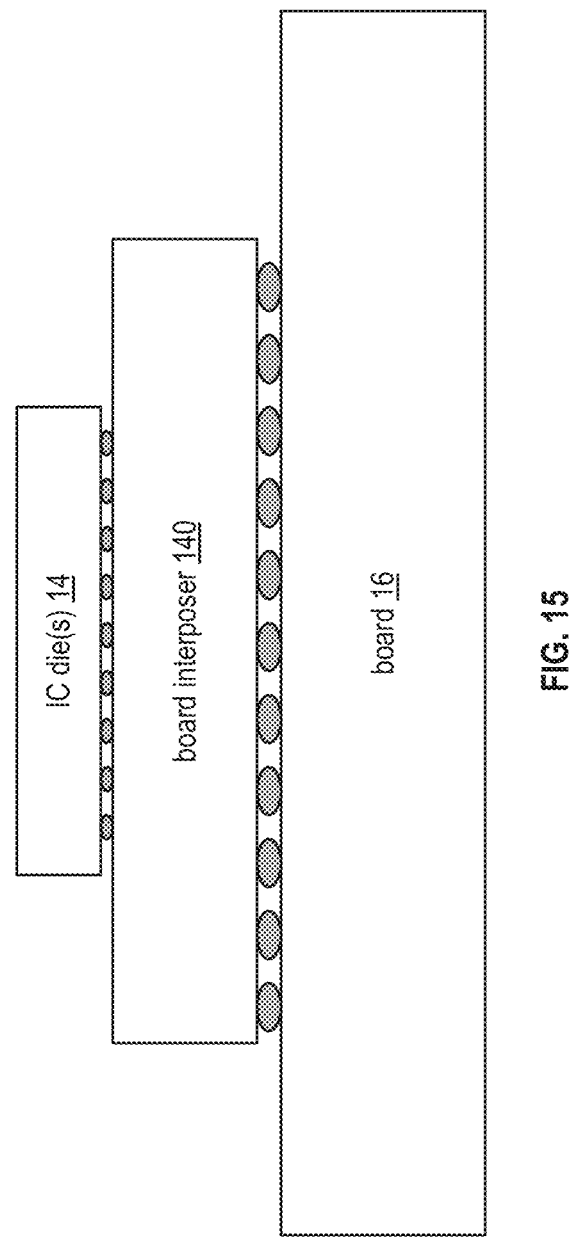
FIG. 15 is a schematic block diagram of another embodiment of a radio circuit in accordance with the present invention.

FIG. 15 is a schematic block diagram of another embodiment of a radio circuit 10 that includes the liquid MEMS component 18 coupled to the variable circuit 22 of the front-end module via a board interposer 140. As shown, one or more IC dies 14 are coupled to a board interpose 140, which is coupled to a board 16. The board interpose 140 may include one or more liquid MEMS components and includes coupling to electrically connect to the dies 14 and to the board 16. Note that the board interposer 160 may be of the same material as the board 16 or of a different board material.

Figure 16:
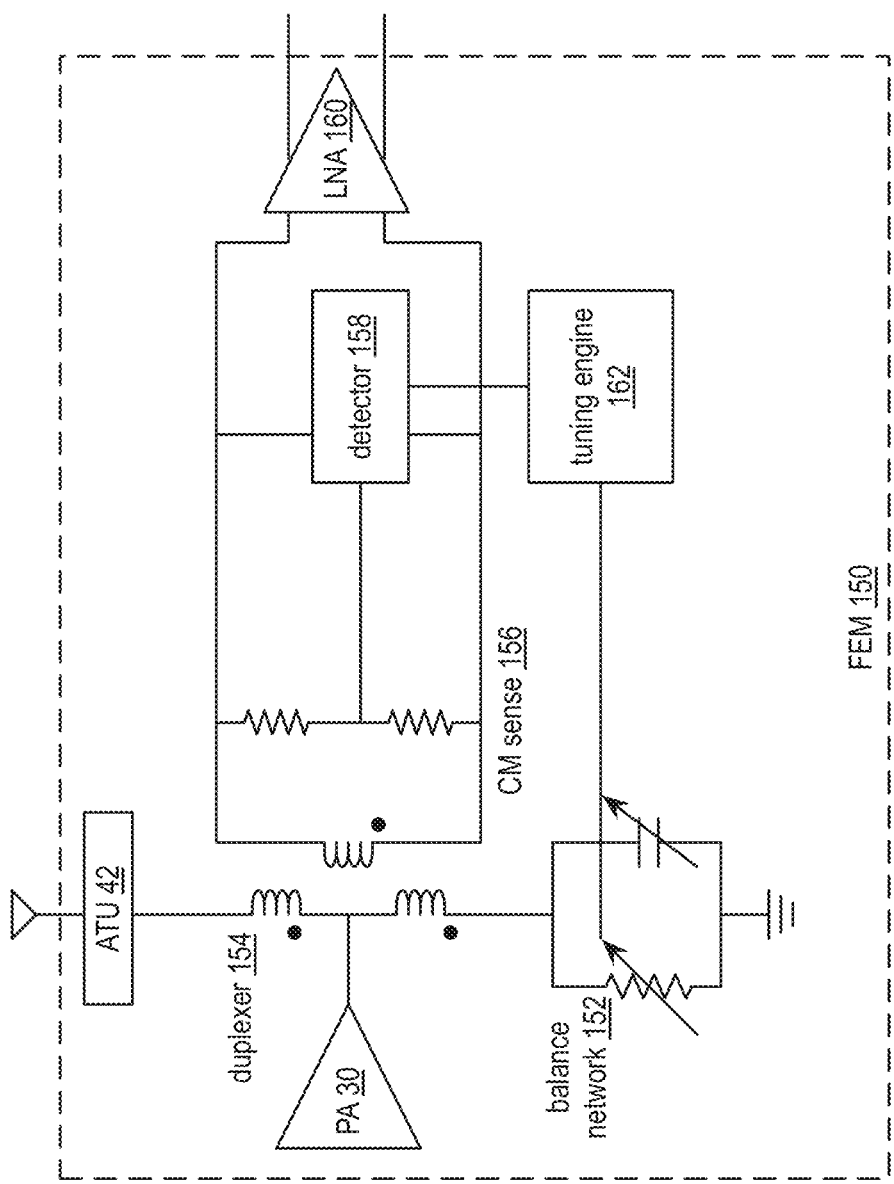
FIG. 16 is a schematic block diagram of another embodiment of a front-end module in accordance with the present invention.

FIG. 16 is a schematic block diagram of another embodiment of a front-end module 150 that includes a power amplifier module (PA) 30, an ATU 42, a duplexer 154 (to provide RX TX isolation), a balance network 152, a common mode (CM) sensing circuit 156, a detector 158, a tuning engine 162, and may further include a low noise amplifier (LNA) 160. The duplexer 154 includes a transformer (or other structure such as a frequency selective duplexer and/or an electrical balance duplexer) and the balancing network 152 includes at least a variable resistor and at least one variable capacitor, which may be implemented using one or more of liquid MEMS switches, liquid MEMS capacitors, liquid MEMS inductors, etc. (e.g., as shown in one or more of FIGS. 6 and 8-11). The common mode sensing circuit 156 includes a pair of resistors coupled across the secondary of the transformer.

In an example of operation, the PA 30 supplies an outbound RF signal to the center tap of the dual winding primary of the transformer 154. Current of the outbound RF signal is split between the two windings proportional to the difference in impedance between the antenna and the balancing network 152. If the impedance of the balancing network 152 substantially matches the impedance of the antenna, the current is essentially equally split between the two windings.

With the winding configuration as shown, if the currents in the primary windings substantially match, their magnetic fields essential cancel each other in the secondary winding. Thus, the secondary has a substantially attenuated representation of the outbound RF signal. For an inbound RF signal, the two windings of the primary generate a magnetic field corresponding to the current of the inbound RF signal. In this instance, the magnetic fields are added, thus producing twice the current in the secondary than in the primary (assuming each of the windings has the same number of turns). As such, the transformer 154 amplifies the inbound RF signal.

If there is an imbalance between the impedance of the antenna and the impedance of the balancing network 152, an outbound RF signal current component will be present in the secondary (e.g., TX leakage). The detector 158 detects the imbalance via the CM sense circuit 156 and provides an indication of the difference to the tuning engine module 162. The tuning engine module 162 interprets the difference and generates a control signal to adjust the impedance of the balance network 152.

FIG. 17 is a schematic block diagram of an embodiment of a balancing network 152 that includes a plurality of resistors (R), a plurality of capacitors (C), a control module, and plurality of liquid MEMS switches (L-MEMS SW). The resistors, capacitors, and control module are on the IC and the switches are on the board. The control module generates control signals to enable selected ones of the liquid MEMS switches to produce a desired small signal balancing network 152.

FIG. 18 is a schematic block diagram of another embodiment of a large signal balancing network 152 that includes an RLC (resistor-inductor-capacitor) network, a control module, and a plurality of liquid MEMS switches (L-MEMS SW). The liquid MEMS switches are tuned on and off to provide different combinations of resistors, inductors, and/or capacitors of the RIC network to provide the desired impedance of the balance network 152. Note that the RLC network and the control module are on the IC 14 and the liquid MEMS switches are on the board 16.

FIG. 19 is a schematic block diagram of another embodiment of a balancing network 152 that includes one or more variable resistors (R1 and R2), one or more variable capacitors (C1 and C2), and a variable inductor (L). One or more of the components (e.g., resistors, capacitors, inductors) may be changed via the control signal 24. Each of the variable components may be implemented as a variable liquid MEMS component (as shown in FIGS. 10-12) and/or as a switched bank of circuit elements (as shown in FIG. 6). The switched bank of circuit elements includes circuit elements (e.g., resistors, capacitors, inductors), which are on the IC 14 and liquid MEMS switches, which are on the board 16. Note that one or more of the components (e.g., resistors, capacitors, inductors) of the balancing network 152 may be fixed valued components (e.g., a fixed resistor, a fixed capacitor, and/or a fixed inductor).

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A radio circuit comprises:
   a front-end module implemented on at least one integrated circuit (IC) die, the front-end module including a variable circuit, wherein the variable circuit is adjustable to facilitate an operational adjustment of the front-end module for a given operational condition of the radio circuit;
   a board supporting one or more liquid micro-electro-mechanical system (MEMS) components and supporting, at least indirectly, the at least one IC, wherein a liquid MEMS component of the one or more liquid MEMS components comprises:
   a channel in one or more layers of the board or in one or more layers of a second board;
   one or more conductive elements of the liquid MEMS component;
   a droplet contained in the channel; and
   a droplet activating module operable, based on the control signal, to modify the droplet with respect to the one or more conductive elements thereby changing the one or more characteristics of the liquid MEMS component; and
   a coupling component to electrical couple the one or more liquid MEMS components to the variable circuit, wherein, based on a control signal, one or more characteristics of the one or more liquid MEMS components is changed, which adjusts the variable circuit.

2. The radio circuit of claim 1, wherein the droplet activating module comprises at least one of:
   an electric field source;
   a magnetic field source;
   a heat source;
   a compression source; and
   an expansion source.

3. The radio circuit of claim 1, wherein the droplet comprises at least one of:
   an electrically conductive droplet;
   a liquid insulating droplet;
   an expanding liquid droplet that expands in response to the droplet activating module being operable;
   a contracting liquid droplet that contracts in response to the droplet activating module being operable;
   a repelling liquid droplet that is repelled in response to the droplet activating module being operable; and
   an attraction liquid droplet that is attracted in response to the droplet activating module being operable.

4. The radio circuit of claim 1, wherein the channel comprises at least one of:
   a conductive coating on at least one inner surface of the channel;
   an insulator coating on one or more inner surfaces of the channel; and
   a lid in another layer of the board.

5. The radio circuit of claim 1, wherein the liquid MEMS component further comprises:
   a gas within the channel, wherein the gas facilitates modifying the droplet when the droplet activating module is operable.

6. The radio circuit of claim 1, wherein the board comprises at least one of:
   a printed circuit board (PCB);
   an integrated circuit (IC) package substrate;
   a redistribution layer (RDL) of a PCB or of an IC package substrate.

7. The radio circuit of claim 1, wherein the front-end module comprises at least one of:
   a power amplifier (PA) that includes a PA variable circuit;
   a receiver-transmitter (RX-TX) isolation module that includes an RX-TX variable circuit;
   a radio frequency (RF) filter that includes a filter variable circuit;
   an antenna tuning unit (ATU) that includes an ATU variable circuit; and
   a frequency band (FB) switch, wherein the variable circuit is one of the PA variable circuit, the RX-TX variable circuit, the filter variable circuit, and the ATU variable circuit and wherein the operational adjustment of the front-end module includes at least one of mode selection, ATU tuning, RX-TX isolation tuning, RF filter tuning, and PA configuration.

8. The radio circuit of claim 1, wherein the liquid MEMS component comprises at least one of:
   a liquid MEMS switch;
   a liquid MEMS capacitor;
   a liquid MEMS inductor; and
   a liquid MEMS resistor.

9. The radio circuit of claim 1, wherein the coupling component comprises at least one of:
   a wired connection;
   a paired wireless transmitter and receiver; and
   an interposer substrate.

10. The radio circuit of claim 1, wherein the front end module supports at least one of cellular communications, wireless local area network communications, and personal area network communications.

11. A liquid micro-electro-mechanical system (MEMS) component for use with an integrated circuit (IC) die, the liquid MEMS component comprises:
    a channel;
    one or more conductive elements proximally positioned with respect to the channel;
    a droplet contained in the channel;
    a droplet activating module operable, based on the control signal, to modify the droplet with respect to the one or more conductive elements thereby changing one or more characteristics of the liquid MEMS component; and
    a board supporting the channel and to support the IC die.

12. The liquid MEMS component of claim 11, wherein the droplet activating module comprises at least one of:
    an electric field source;
    a magnetic field source;
    a heat source;
    a compression source; and
    an expansion source.

13. The liquid MEMS component of claim 11, wherein the droplet comprises at least one of:
    an electrically conductive droplet;

a liquid insulating droplet;
an expanding liquid droplet that expands in response to the droplet activating module being operable;
a contracting liquid droplet that contracts in response to the droplet activating module being operable;
a repelling liquid droplet that is repelled in response to the droplet activating module being operable; and
an attraction liquid droplet that is attracted in response to the droplet activating module being operable.

14. The liquid MEMS component of claim 11, wherein the channel comprises at least one of:
a conductive coating on at least one inner surface of the channel;
an insulator coating on one or more inner surfaces of the channel; and
a lid in another layer of the board.

15. The liquid MEMS component of claim 11, wherein the board comprises at least one of:
a printed circuit board (PCB);
an integrated circuit (IC) package substrate;
a redistribution layer (RDL) of a PCB or of an IC package substrate.

16. The liquid MEMS component of claim 11 further comprises:
a coupling component to electrical couple the liquid MEMS component to the IC die, wherein the coupling component comprises at least one of:
a wired connection;
a paired wireless transmitter and receiver; and
an interposer substrate.

17. A radio circuit comprises:
a duplexer, wherein a first connection of the duplexer is for coupling to an antenna;
a power amplifier operably coupled to a second connection of the duplexer;
a common mode sensing circuit operably coupled to a third and fourth connections of the duplexer; and
a balancing network operably coupled to a fifth connection of the duplexer, wherein the balancing network includes a liquid micro-electro-mechanical system (MEMS) component that is changed based on a control signal to adjust one or more characteristics of the balancing network such that the duplexer is tuned to improve isolation between inbound radio frequency (RF) signals and outbound RF signals transceived via the antenna, wherein the liquid MEMS component includes:
a channel;
one or more conductive elements proximally positioned with respect to the channel;
a droplet contained in the channel;
a droplet activating module operable, based on the control signal, to modify the droplet with respect to the one or more conductive elements thereby changing one or more characteristics of the liquid MEMS component; and
a board supporting the channel and supporting an integrated circuit (IC) die that includes at least the common mode sensing circuit.

18. The radio circuit of claim 17 further comprises:
a detector operable to produce a common mode error signal based on an output of the common mode sensing circuit;
a tuning engine to generate the control signal based on the common mode error signal;
a low noise amplifier coupled to the third and fourth connections of the duplexer; and
an antenna tuning unit (ATU) coupled to the first connection of the duplexer.

19. The radio circuit of claim 17, wherein the balancing network comprises at least one of:
a small signal balancing network that includes a plurality of liquid MEMS switches, wherein the plurality of liquid MEMS switches includes the liquid MEMS component; and
a large signal balancing network that includes an RLC (resistor-inductor-capacitor) network and a plurality of liquid MEMS switches.

20. The radio circuit of claim 17, wherein the balancing network comprises:
one or more liquid MEMS resistors;
one or more liquid MEMS capacitors; and
one or more liquid MEMS inductors coupled to the one or more liquid MEMS resistors and the one or more liquid MEMS capacitors to produce an RLC (resistor-inductor-capacitor) network, wherein the one or more liquid MEMS resistors, the one or more liquid MEMS capacitors, and the one or more liquid MEMS inductors includes the liquid MEMS component.

* * * * *